United States Patent
Matsumiya et al.

[11] Patent Number: 6,115,284
[45] Date of Patent: Sep. 5, 2000

[54] MEMORY DEVICE WITH FASTER WRITE OPERATION

[75] Inventors: Masato Matsumiya; Satoshi Eto; Masato Takita; Toshikazu Nakamura; Ayako Kitamoto; Kuninori Kawabata; Hideki Kanou; Masatomo Hasegawa; Toru Koga; Yuki Ishii, all of Kawasaki, Japan

[73] Assignee: Fujitsu Limited, Kanagawa, Japan

[21] Appl. No.: 09/317,902

[22] Filed: May 25, 1999

[30] Foreign Application Priority Data

Oct. 27, 1998 [JP] Japan .................................. 10-305662

[51] Int. Cl.[7] .................................................. G11C 11/24
[52] U.S. Cl. .......................................... 365/149; 365/203
[58] Field of Search .............................. 365/149, 189.01, 365/203, 226

[56] References Cited

U.S. PATENT DOCUMENTS 5,612,921  3/1997  Chang et al. ............................ 365/226

*Primary Examiner*—Terrell W. Fears
*Attorney, Agent, or Firm*—Arent Fox Kintner Plotkin & Kahn

[57] ABSTRACT

The present invention relates to a memory device including memory cells each formed of a cell transistor connected to bit and word line and a cell capacitor. The memory device includes a pre-charging circuit for pre-charging bit line to a first voltage, a sense amplifier for detecting voltages of bit lines and driving the bit lines to a second voltage for H level or a third voltage for L level, and a word line driving circuit for driving word lines to make the writing voltage for H level of the cell capacitor to a fourth voltage lower than the second voltage. The present invention is characterized in that the first voltage is lower than an intermediate value between the second and third voltages. According to the present invention, it becomes possible to prevent the voltage $V_{ds}$ of the cell transistor from being zero by setting the writing voltage (fourth voltage) for H level of the cell capacitor to be lower than the voltage for H level (second voltage) of the bit line, thus reducing a time of writing or re-writing data. Additionally, a pre-charge voltage (first voltage) of the bit lines is set to be lower than the half of the amplitude of the bit line. Thereby, it also becomes possible to prevent the very small voltage of the bit line from being smaller according to the lowered H level voltage in the memory cell.

7 Claims, 9 Drawing Sheets

FIRST EMBODIMENT

READ OPERATION IN THE PRIOR ART

WRITE OPERATION IN THE PRIOR ART

FIG. 4

ARCHITECTURE OF DRAM OF THE PRESENT INVENTION

| Embodiment | Bit line pre-charge voltage $V_{PR}$ | Bit line drive voltage $V_{BLD}$ | Writing voltage in a memory cell $V_{ST}$ | Existence of dummy cell |
|---|---|---|---|---|
| 1 | GND | Vii | Vii $-\Delta$V | Yes |
| 2 | Vii/3 ($\frac{Vii}{2}$ ~ GND) | Vii | Vii $-\Delta$V | No |

FIRST EMBODIMENT

READ OPERATION IN THE FIRST EMBODIMENT

WRITE OPERATION IN THE FIRST EMBODIMENT

WRITE OPERATION IN THE SECOND EMBODIMENT

MEMORY DEVICE WITH FASTER WRITE OPERATION

BACKGROUND OF THE INVENTION

1. Field of the Invention

The present invention relates to a memory device including one transistor type memory cells. More particularly, it relates to a memory device, in which a speed for write operation of H level voltage from bit lines to the memory cells can be made to faster, and to a method for driving the memory device.

2. Description of the Related Art

Capacity of a Dynamic RAM (DRAM) having one transistor type memory cells has been increased, and the power supply voltage has been lowered. It has been proposed that a power supply voltage, which is now 3.3 V, is made to 2.5V or 1.8V, for example. Therefore, a DRAM should be developed for reading or writing data in high speed even when it is under the lower power supply voltage.

FIG. 1 is a circuit diagram of the conventional DRAM. As is shown in FIG. 1, the conventional DRAM includes memory cells $MC_0$ and $MC_1$ disposed at the cross-positions between a bit line pair BL and /BL and a word line pair $WL_0$ and $WL_1$. The memory cells $MC_0$ and $MC_1$ respectively include transistors $Q_0$ and $Q_1$ and capacitors ST. A sense amplifier SA, an equalizing circuit 200 for shorting between the bit lines, and a pre-charging circuit 100 for driving the bit line pairs to a pre-charge voltage are provided to the bit line pair BL and /BL.

FIG. 2 is an operating waveform diagram for the read operation in the conventional DRAM of FIG. 1. The read operation will be now explained in accompanying to FIG. 2 in brief. At first, pre-charging and equalizing are released in status where the bit line pair BL and /BL are pre-charged to a level $V_{ii}/2$, which is half of the internal power supply $V_{ii}$. Then, the bit line pair BL and /BL are temporally in floating status. When the word line $WL_0$ rises, charges of the capacitor ST in the memory cell $MC_0$ storing H level are supplied to the bit line BL to increase the voltage of the bit line BL for very small voltage. The sense amplifier SA detects a voltage difference between the bit line pair by driving each of sense amplifier activation signals SE and /SE, and drives one bit line BL to the internal power supply $V_{ii}$ and the other bit line /BL to the ground voltage GND. The levels of the bit lines are externally read out via data bus lines, not shown in the diagram.

When driving the bit line BL to the internal power supply $V_{ii}$, the above-described amplifier SA also drives the capacitor voltage ST in the memory cell $MC_0$ to the internal power supply $V_{ii}$ via a cell transistor $Q_0$, in the same way of that. Then the word line $WL_0$ falls so that the capacitor voltage ST in the memory cell $MC_0$ maintains the internal power supply level $V_{ii}$. Then, the bit line pair BL and /BL are reset to the pre-charge voltage level $V_{ii}/2$, again, by rising a bit line reset signal BLR.

FIG. 3 shows an operating waveform diagram for write operation in the conventional DRAM of FIG. 1. The writing operation is different from the read operation shown in FIG. 2. After the sense amplifier SA drives the bit line pair BL and /BL, a writing circuit, not shown in the diagram, drives the bit line pair BL and /BL. In the example of FIG. 3, the read operation of data at L level for the memory cell $MC_0$, and the write operation of data at H level after the read operation are shown. In this case, the condition of the sense amplifier SA is reversed, the bit line BL is driven from the ground voltage to the power supply voltage $V_{ii}$, and the voltage $V_{ii}$ is stored in the capacitor ST of the memory cell $MC_0$.

In the conventional DRAM, as shown in FIG. 2, the pre-charge voltage of the bit lines is set to a voltage $V_{ii}/2$, which is half of the internal power supply $V_{ii}$, and the drive voltage of the H level bit line and a capacitor voltage for H level in the memory cell according to the drive voltage are set to the internal power supply $V_{ii}$. The pair of bit lines are driven to the voltage $V_{ii}$ for the H level and to the ground voltage for the L level, so as to charge the capacitors in the memory cells with each voltage. Then, the bit line pair is reset to the pre-charge voltage $V_{ii}/2$ again by shorting the bit line pair.

However, when the above-described conventional memory device writes or re-writes data to memory cells, since the voltage $V_{BLD}$ (=$V_{ii}$) of the H level bit line and the H level voltage $V_{ST}$ (=$V_{ii}$) of the capacitor ST in the memory cell are set to the same voltage level $V_{ii}$, therefore, it takes a long time to pull up the voltage $V_{ST}$ of the cell capacitor ST to the voltage $V_{ii}$ for the H level. In other words, the word line WL is driven to a voltage higher than the voltage $V_{ii}$ on the H level bit line for a threshold voltage $V_{th1}$ of the cell transistor or more. Therefore, a sufficient high voltage is applied to a gate of the cell transistor. However, when considering a relationship between the voltage $V_{ii}$ of the bit line and the voltage $V_{ST}$ of the cell capacitor ST, as the voltage $V_{ST}$ of the cell capacitor ST is being close to the voltage $V_{ii}$ of the bit line, a voltage $V_{ds}$ between a source and a drain of the cell transistor becomes small, and an amount of currents flowing from the bit line to the cell capacitor ST becomes smaller. As a result, it takes a long time for the voltage $V_{ST}$ of the cell capacitor ST to reach to the voltage $V_{ii}$ of the bit line.

Although there is a general demand to make the speed of the read operation to faster, it is also required to shorten a cycle time for random access by shortening write or re-write operation to the memory cell. Therefore, it is important to reduce the operation time of writing and re-writing to the memory cell.

In this case, it is considered as one solution that the cell capacitor voltage is only set to be lower than the drive voltage on the H level bit line in order to prevent a slow operation in an area where the voltage $V_{ds}$ of the cell transistor is lowered. However, if the voltage is set in such a way in case the pre-charge voltage of the bit lines is set to a voltage $V_{ii}/2$, which is half of the voltage of the H level bit line, the increased voltage of the bit line when driving the word line becomes smaller in accordance to the lowered H level voltage in the memory cell, thus making it difficult to detect a very small voltage difference between the bit line pair by the sense amplifier.

SUMMARY OF THE INVENTION

Therefore, it is an object of the present invention to provide a memory device, in which a time for re-writing or writing data to memory cells is reduced and a reading sensitivity is made to be higher.

It is another object of the present invention to provide a memory device, in which a time for re-writing or writing to a memory cell can be reduced, and cope with a lower power supply voltage.

According to the present invention, the above-described objects can be achieved by a memory device including memory cells each having a cell capacitor for data storage and a cell transistor connected to bit and word line, comprising a pre-charging circuit for pre-charging the bit line to a first voltage; a sense amplifier for sensing voltage of the bit lines and driving the bit line to a second voltage for H level or a third voltage for L level; and a word line driving circuit for driving the word line so as to make the writing voltage for H level of the cell capacitor to a fourth voltage lower than the second voltage; wherein the first voltage is lower than an intermediate value between the second and third voltages.

According to the present invention, it becomes possible to prevent a voltage $V_{ds}$ between a source and drain of the cell transistor from being zero or nearly zero by setting the voltage for the H level of the capacitor (the fourth voltage) to be lower than the voltage (the second voltage) for the H level of the bit line, so that a time of writing or re-writing data can be reduced. Additionally, the pre-charge voltage (the first voltage) of the bit lines is set to be lower than a voltage, which is half of the amplitude of the bit line. Thereby, it becomes possible to prevent the small voltage of the bit lines from being smaller in accordance to the lowering of the H level voltage in the memory cell.

In a preferred example of the present invention, the pre-charge voltage (first voltage) of the bit lines is set to a ground voltage or a voltage around or near the ground voltage. A voltage difference, between the case one bit line voltage rises for a very small voltage by the charge of memory cell and the case the bit line voltage does not rise because of no charge in memory cell, can be detected by employing a reference voltage of the other bit line generated by dummy cells. Then, it becomes possible to properly drive the sense amplifier by setting the pre-charge voltage of the bit lines to a ground voltage or a voltage around or near the ground voltage, even when a low power supply voltage.

BRIEF DESCRIPTION OF THE DRAWINGS

FIG. 4 shows an architecture of a memory device according to the present invention.

DESCRIPTION OF THE PREFERRED EMBODIMENTS

Hereinafter, preferred embodiments according to the present invention will be now explained in accompanying to the attached drawings. However, technical scope of the present invention is not limited to the embodiments.

FIG. 4 shows an architecture of a memory device according to the present invention. In FIG. 4, a pre-charge voltage (first voltage) $V_{PR}$ of bit lines, a drive voltage $V_{BLD}$ for the H level bit line, a write voltage $V_{ST}$ for H level to a cell capacitor in a memory cell, and existence of dummy cells for the use in the first and second embodiments are shown.

In the first embodiment, the pre-charge voltage $V_{RP}$ of the bit lines is set to the ground voltage GND, the drive voltage $V_{BLD}$ for the H level bit line is set to the internal power supply $V_{ii}$, and the write voltage $V_{ST}$ for H level is set to the memory cell to a voltage $(V_{ii}-\Delta V)$ lower than the internal power supply $V_{ii}$ for a predetermined voltage $\Delta V$, respectively. Dummy cells are provided to generate a reference voltage for the bit line pair.

In the second embodiment, the pre-charge voltage VPR of the bit lines is set to a voltage lower than the half of the internal power supply $V_{ii}$, for example, $V_{ii}/3$, and the other voltages $V_{BLD}$ and $V_{ST}$ are set to the same voltages as the first embodiment. In the other words, the pre-charge voltage $V_{PR}$ is set to a voltage lower than the voltage, which is half of the drive voltage $V_{BLD}=V_{ii}$ for the H level bit line.

It becomes possible to make the speed of write operation for the memory cell faster by setting to the above-described architecture. That is, when the H level voltage is written to the memory cell, since the drive voltage $V_{BLD}$ of the bit lines is set to be higher than the write voltage $V_{ST}$ for H level to the cell capacitor, therefore, the voltage $V_{ds}$ of the cell transistor is always maintained more than a predetermined voltage, thus it is prevented from slowing the speed of flowing the current from the bit lines to the cell capacitor. Secondly, although the voltage $V_{ST}$ in the memory cell becomes lower than the internal power supply $V_{ii}$ for the drive voltage of the bit line, as the pre-charge voltage $V_{PR}$ of the bit line is set to be lower than the voltage level $V_{ii}/2$, which is half of the amplitude of the conventional bit line, the rising voltage of the bit line due to the charges in the memory cell when reading data can be sufficiently large. Thirdly, as the pre-charge voltage $V_{PR}$ of the bit line is set to be lower, a P type MOS transistor in the sense amplifier can be driven sufficiently, even if the internal power supply $V_{ii}$ is set to be lower.

Figure 1:
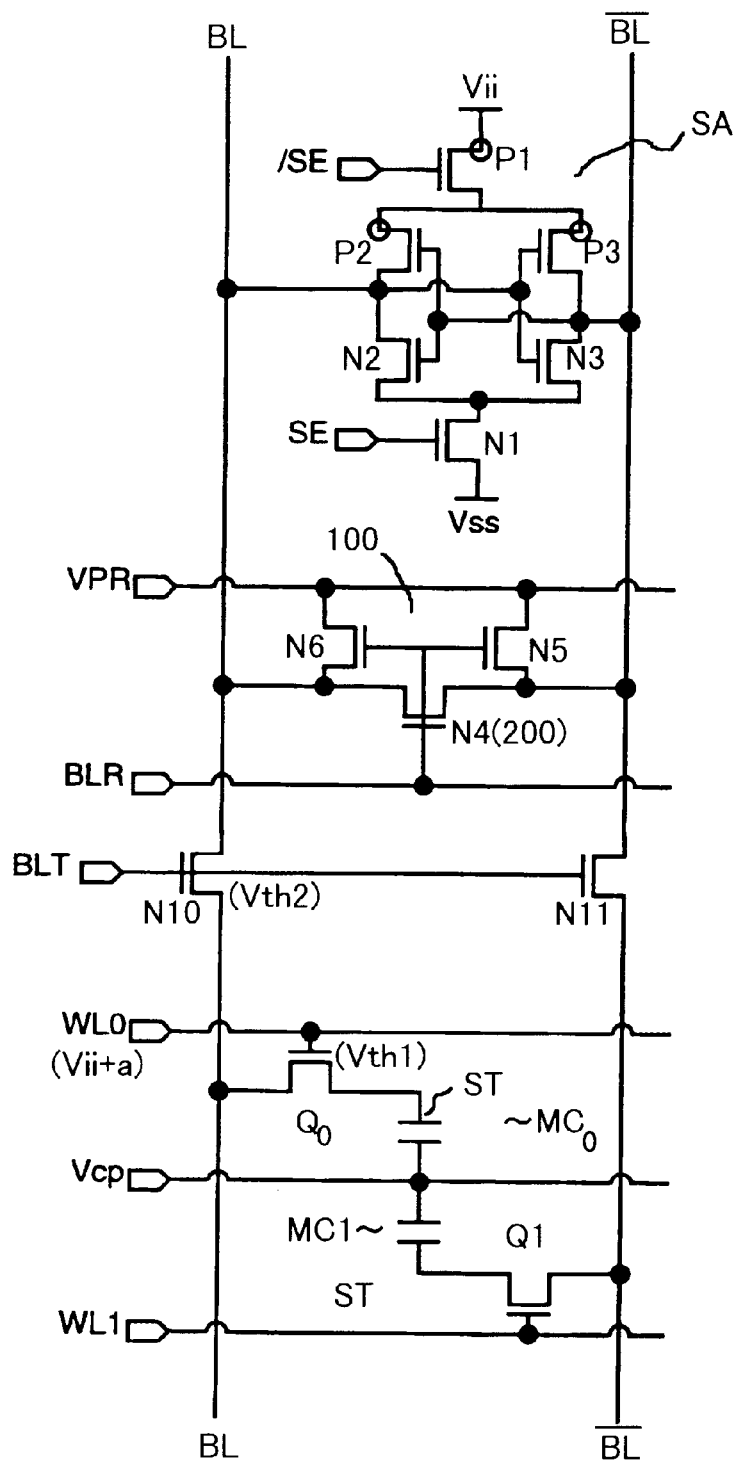
FIG. 1 is a circuit diagram of the conventional DRAM.
Figure 5:
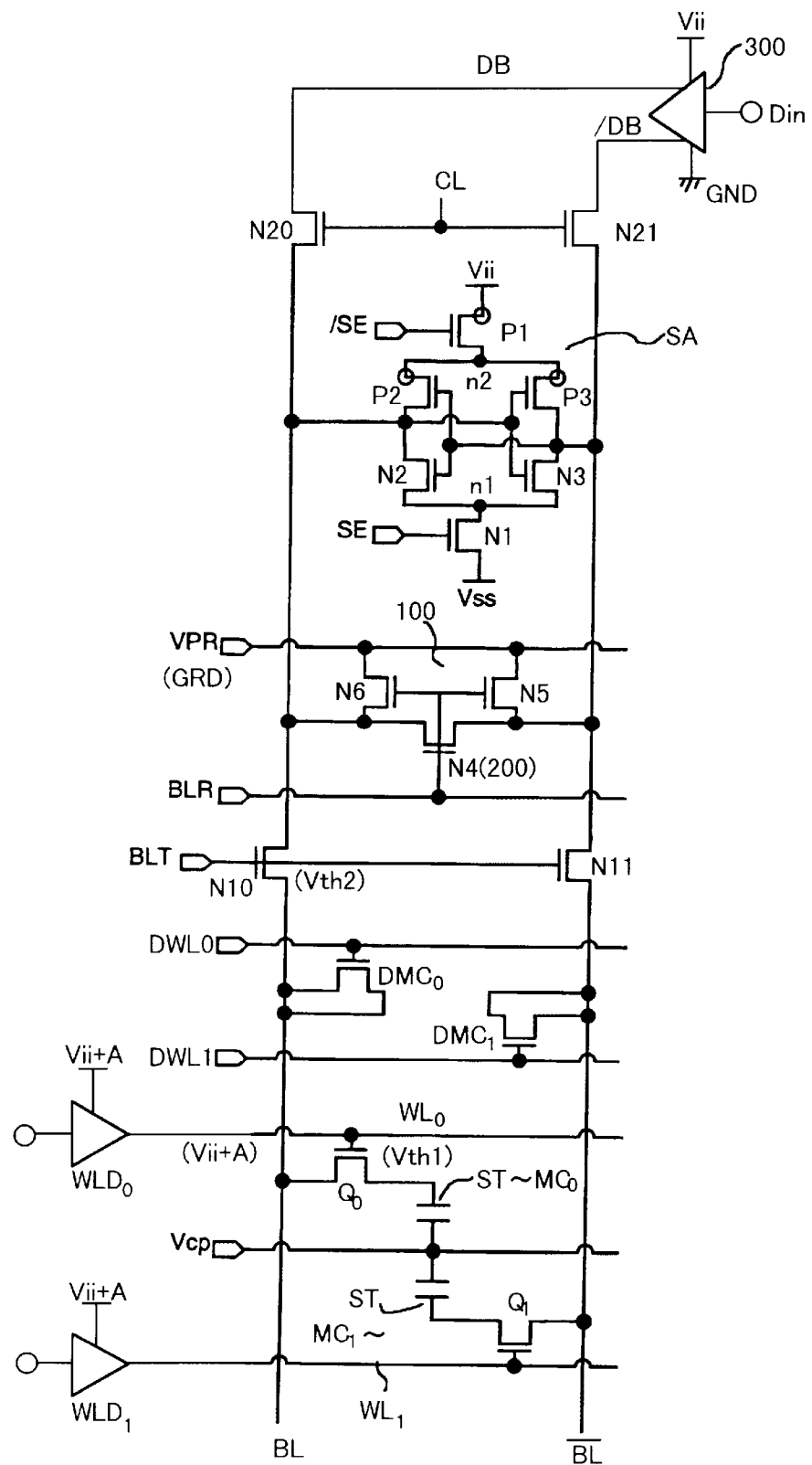
FIG. 5 is a circuit diagram of a DRAM in the first embodiment.

FIG. 5 is a circuit diagram of a DRAM according to the first embodiment of the present invention. In FIG. 5, the same reference numerals or symbols are given to those in the circuit shown in FIG. 1. The memory cells $MC_0$ and $MC_1$ disposed on the cross-positions between the bit lines BL and /BL and the word lines $WL_0$ and $WL_1$ respectively include transistors $Q_0$ and $Q_1$ and capacitors ST. The sense amplifier SA, which is driven by the bit line pair BL and /BL, includes P type transistors P1 to P3 and N type transistors N1 to N3, similarly to the conventional memory device. By applying the sense amplifier activation signals SE and /SE to gates of the transistors P1 and N1, the sense amplifier SA detects a voltage between the bit line pair BL, /BL, and drives one bit line to the internal power supply $V_{ii}$ and the other bit line to the ground voltage $V_{SS}$. Therefore, the drive voltage $V_{BLD}$ for the H level bit line is set to the internal power supply $V_{ii}$.

An equalizing circuit 200 for shorting the bit line pair in response to the reset signal BLR and a pre-charging circuit 100 for making the bit line pair BL and /BL to the pre-charge voltage $V_{PR}$ in response to the reset signal BLR are further provided to the bit line pair. The equalizing circuit 200 comprises a N type transistor N4, and the pre-charging circuit 100 comprises N type transistors N5 and N6. The pre-charge voltage $V_{PR}$ is set to the ground voltage GND $(=V_{SS})$.

Bit line transfer gates N10 and N11 comprised of a N type transistor are provided between the bit line pair on which the sense amplifier SA is provided and the bit line pair on which the memory cell MC is provided, and becomes conductive by a bit line transfer signal BLT so as to connect the bit line pair BL, /BL with the memory cells to the sense amplifier SA.

The bit line pair BL and /BL are connected to the data bus line pair DB and /DB via column gates N20 and N21, which becomes conductive, in response to a column selective signal CL. A writing circuit 300 for driving the data bus line pair according to write data $D_{in}$ is provided to the data bus line pair DB and /DB. The writing circuit 300 drives one data bus line to the internal power supply voltage $V_{ii}$, and the other data bus line to the ground voltage $V_{SS}$, in accordance to the write data $D_{in}$. The writing circuit 300 concurrently drives the bit line pair BL and /BL via the column gates N20 and N21 to write data to the memory cells.

Additionally, dummy memory cells $DMC_0$ and $DMC_1$ are provided on each of the bit lines. A reference voltage for reading data is generated at one bit line by driving one of the dummy word lines $DWL_0$ and $DWL_1$. When the pre-charge voltage $V_{PR}$ of the bit lines is set to the ground voltage, the bit line rises for a very small voltage by the memory cell storing H level. However, the bit line voltage is not changed by the memory cell storing L level, and therefore, it is required to generate an intermediate reference voltage between the voltages of the bit lines by the dummy cells. Therefore, the dummy memory cells are required in case that the pre-charge voltage $V_{PR}$ of the bit lines is the ground voltage.

Additionally, the word lines $WL_0$ and $WL_1$ are driven by the word line driving circuits $WLD_0$ and $WLD_1$. The driving level of the word lines are set to a voltage higher than the internal power supply $V_{ii}$ for a predetermined voltage A. The voltage A is set to a voltage smaller than the threshold voltage Vth of the cell transistor. As a result, the writing voltage $V_{ST}$ for the H level cell capacitor ST in the memory cell becomes lower than the drive voltage $V_{BLD}$ on the H level bit line BL or /BL. In other words, the driving level ($V_{ii}$+A) of the word lines are set to be a voltage higher than the writing voltage $V_{ST}$ by the threshold voltage $V_{th1}$ of the cell transistor Q.

Figure 6:
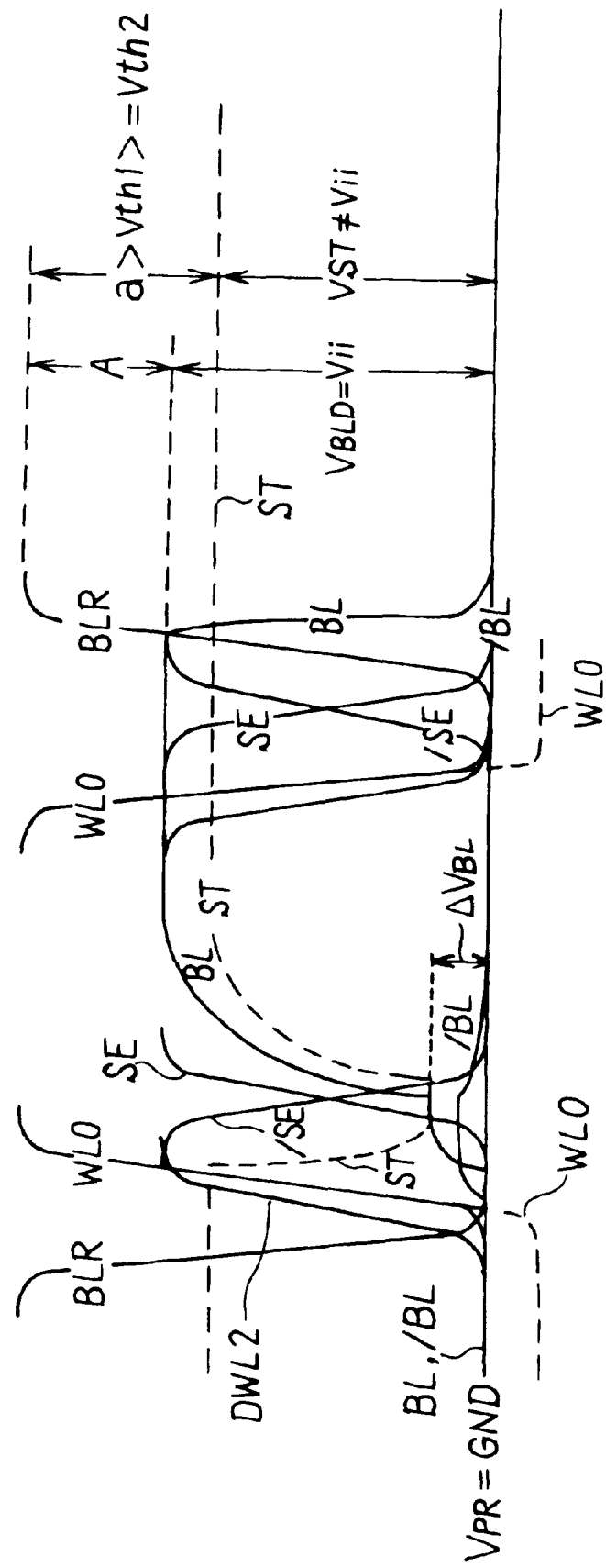
FIG. 6 is an operating waveform diagram for the read operation in the first embodiment.

FIG. 6 is an operating waveform diagram showing the read operation in the first embodiment. The read operation in the first embodiment will be now explained in accordance to this operating waveform diagram. At first, the bit line pair BL and /BL are pre-charged to the ground voltage. In the first embodiment, the word line WL maintains a negative voltage in that time. As the pre-charge voltage of the bit line pair BL and /BL is the ground voltage, the voltage of the word line WL connected to a gate of the cell transistor maintains a negative voltage without conducting or leaking the cell transistor of the memory cell in non-selective state. When finishing the pre-charging period, the pre-charging signal BLR of the bit line falls, and the word line $WL_0$ and the dummy word line $DWL_1$ rise. The word line driving circuit $WLD_0$ drives the word line $WL_0$ to a voltage ($V_{ii}$+A) higher than the internal power supply $V_{ii}$ for a predetermined voltage A. In the example of FIG. 6, the memory cell $MC_0$ stores the H level, therefore, the voltage $V_{ST}$ of the cell capacitor ST of the memory cell $MC_0$ is the H level.

The cell transistor $Q_0$ becomes conductive in response to the rise of the word line $WL_0$, and the voltage of the bit line BL increases only for the very small voltage $\Delta V_{BL}$ from the ground voltage. Further, the other bit line /BL also increases only for a voltage, which is approximately half of the very small voltage $\Delta V_{BL}$, via the dummy memory cell $DMC_1$, in response to the rise of the dummy word line $DWL_1$.

As the pre-charge voltage $V_{PR}$ of the bit lines is the ground voltage in this embodiment, the amount of charges $\Delta Q$ flowing from the memory cell $MC_0$ to the bit line BL is:

$$Q = V_{ST} \cdot C_{ST}$$

where $C_{ST}$ means a capacity of the capacitor ST. The amount of charges flowing to the other bit line /BL by the dummy memory cell is set to be half of the amount $\Delta Q$. Therefore, the amount of charges for generating the very small voltage difference between the bit line pairs can be expressed as follows:

$$\Delta Q/2 = V_{ST} \cdot C_{ST}/2 \qquad (1)$$

If the bit line pre-charge voltage $V_{PR}$ is the voltage $V_{ii}/2$, which is half of the voltage of the H level bit line, as mentioned above in the prior art, the amount of the charges $\Delta Q$ for generating a voltage difference between the bit line pair can be expressed as:

$$\Delta Q = (V_{ST} - V_{ii}/2) \cdot C_{ST}$$

Here, as $V_{ST} = V_{ii} - \Delta V$, the amount of charges $\Delta Q$ is:

$$\begin{aligned} Q &= \{V_{ST} - (V_{ST} + \Delta V)/2\} \cdot C_{ST} \qquad (2) \\ &= (V_{ST} - \Delta V) \cdot C_{ST}/2 \end{aligned}$$

In comparison with the amount of charges obtained by the above-described equation (1), the voltage decreases by $\Delta V \cdot C_{ST}/2$.

As described above, in case that the voltage for the H level in the memory cell is lower than the H level drive voltage of the bit lines by $\Delta V$, if the pre-charge voltage of the bit lines is set to $V_{ii}/2$, similarly to the prior art, the voltage difference between the bit line pair generated by the charges in the memory cells decreases. On the contrary, when the pre-charge voltage of the bit lines is set to be the ground voltage, as shown in the first embodiment, the voltage difference equivalent to the prior art can be generated between the bit line pair, as shown by the above-described equation (1).

Returning to FIG. 6, after the very small voltage $\Delta V_{BL}/2$ is generated between the bit line pair, the sense amplifier SA activates in response to the sense amplifier activation signals SE and /SE. The sense amplifier SA makes the transistors N1 and P1 conductive according to the sense amplifier activation signals SE and /SE, and respectively drives a node n1 to the ground voltage side and a node n2 to the internal power supply $V_{ii}$ side. Then, the voltages of the bit line pair having a difference of the very small voltage $\Delta V_{BL}/2$ near the ground voltage is mainly detected by the P type transistors P2 and P3 of which source terminals are commonly connected to the node n2, and the conductive transistor P2 rises the bit line BL to the internal supply voltage $V_{ii}$. When rising the bit line BL to the internal power supply $V_{ii}$ side, the N type transistor N3 becomes conductive and the other bit line /BL falls to the ground voltage side. As a result, the bit line BL is driven to the internal power supply $V_{ii}$, and the other bit line /BL is driven to the ground voltage. In other words, the voltage $V_{BLD}$ of the H level bit line becomes the internal power supply $V_{ii}$.

If a threshold voltage of the cell transistor $Q_0$ is $V_{th1}$, the drive voltage $V_{WL}$ of the word line $WL_0$ is set to:

$$V_{WL} = V_{ST} + V_{th1}$$

The voltage of the cell capacitor ST in the memory cell $MC_0$ is risen to the voltage $V_{ST}$ for the H level side, as the bit line BL is driven to the internal power supply $V_{ii}$. As the voltage $V_{ST}$ for the H level side of the memory cell is set to be lower than the drive voltage $V_{ii}$ of the bit line BL ($V_{ST} < V_{ii}$), the voltage $V_{ds}$ between the drain and the source of the conductive cell transistor $Q_0$ always becomes more than the predetermined voltage ($V_{ii}-V_{ST}=\Delta V$). Therefore, the voltage of the cell capacitor ST can be reached to the voltage $V_{ST}$ for the H level side in a short time.

When the bit line pair are respectively driven to the ground voltage and the internal voltage, the column gates N20 and N21 become conductive, and the voltages of the bit line pair are read out from a reading circuit, not shown in the diagram, via the data bus line pair DB and /DB.

When finishing to read the data, the word line $WL_0$ falls and becomes negative. Then, the sense amplifier activation signals SE and /SE also return to a non-activate status, and the reset signal BLR rises. At the same time when the transistor N4 of the equalizing circuit 200 becomes conductive in response to the reset signal BLR, the transistors N5 and N6 of the resetting circuit 100 also become conductive, and the bit line pair BL and /BL are pre-charged to the ground voltage.

As it is apparent from the above-described operating explanation that the voltage $V_{ST}$ for the H level side of the memory cell is set to be lower than the voltage $V_{BLD}=V_{ii}$ for the H level bit line, it becomes possible to flow the charges from the driven bit line to the cell capacitor in the memory cell earlier, and to make the cell capacitor voltage to the voltage $V_{ST}$ in a shorter time. Additionally, as the pre-charge voltage of the bit lines is set to be the ground voltage, the small voltage difference generated between the bit line pair maintains the same level as the prior art, even when the voltage for the H level side of the memory cell is set to be lower than the drive voltage of the bit lines. Therefore, it is possible to maintain easiness of reading data by the sense amplifier and it is possible to increase the speed of re-writing data to the memory cell at the same time.

Figure 7:
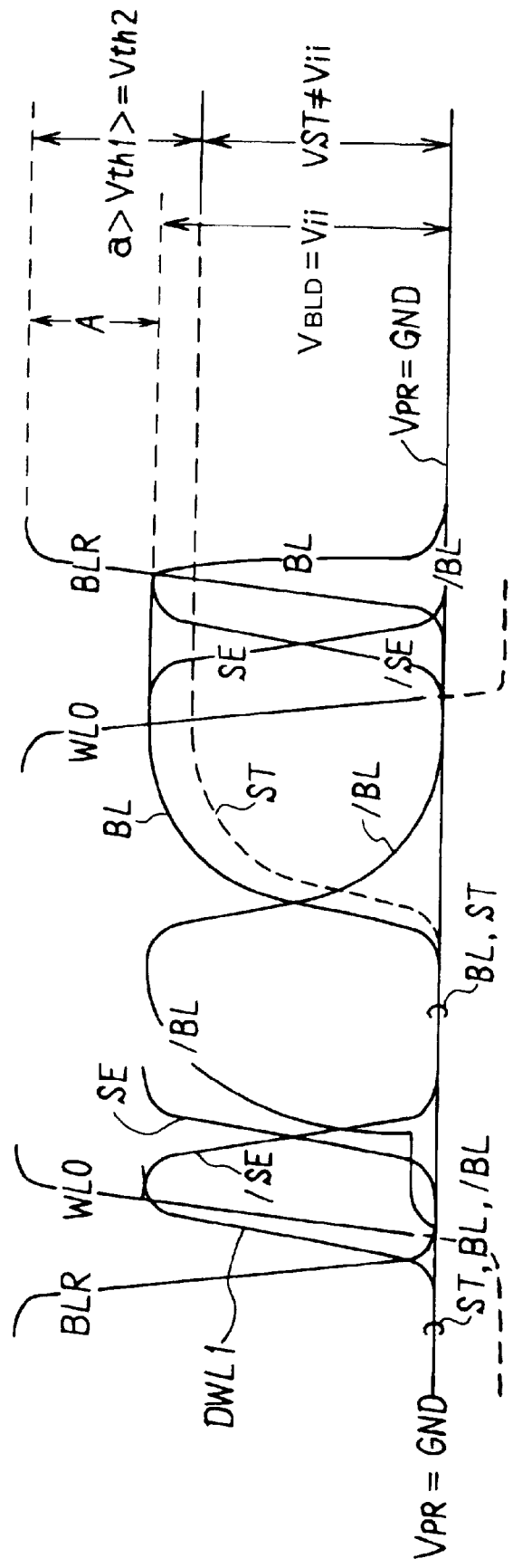
FIG. 7 is an operating waveform diagram for the write operation in the first embodiment.

FIG. 7 is an operating waveform diagram showing a writing operation of the first embodiment. In the example of FIG. 7, an operation of writing H level data to the memory cell $MC_0$ by the writing circuit 300 from the status where the L level data is stored in the memory cell MC. The H level drive voltage $V_{BLD}$ of the bit lines, the H level voltage $V_{ST}$ of the memory cell, and the pre-charge voltage $V_{PR}$ of the bit lines can be set as the above-described explanation.

At first, the word line $WL_0$ and the dummy word line $DWL_1$ rise, and the very small voltage is generated between the bit line pair. The voltage of one bit line BL is not changed and the other bit line /BL increases by the very small voltage by the dummy memory cell. Then, the sense amplifier SA is activated, the voltage of one bit line BL is not changed, and the other bit line /BL is driven to the internal power supply $V_{ii}$ ($=V_{BLD}$).

After that, the column gates N20 and N21 become conductive, the writing circuit 300 drives the data bus line pair DB and the bit line BL to the internal power supply $V_{ii}$, and the other data bus line /BL to the ground voltage. The cell capacitor ST of the memory cell $MC_0$ is charged from the bit line BL driven to the H level, and the cell capacitor voltage becomes to the H level voltage $V_{ST}$. As the voltage $V_{BLD}=V_{ii}$ of the H level bit line is higher than the voltage $V_{ST}$ in the memory cell in the write operation, the voltage $V_{ds}$ between the drain and the source of the cell transistor $Q_0$ always becomes higher than the predetermined voltage, thus finishing the write operation in a short time.

After that, the word line $WL_0$ falls, the sense amplifier activation signal SE and /SE are not activated, and the bit line pair are pre-charged to the ground voltage, in response to the reset signal BLR.

Figure 2:
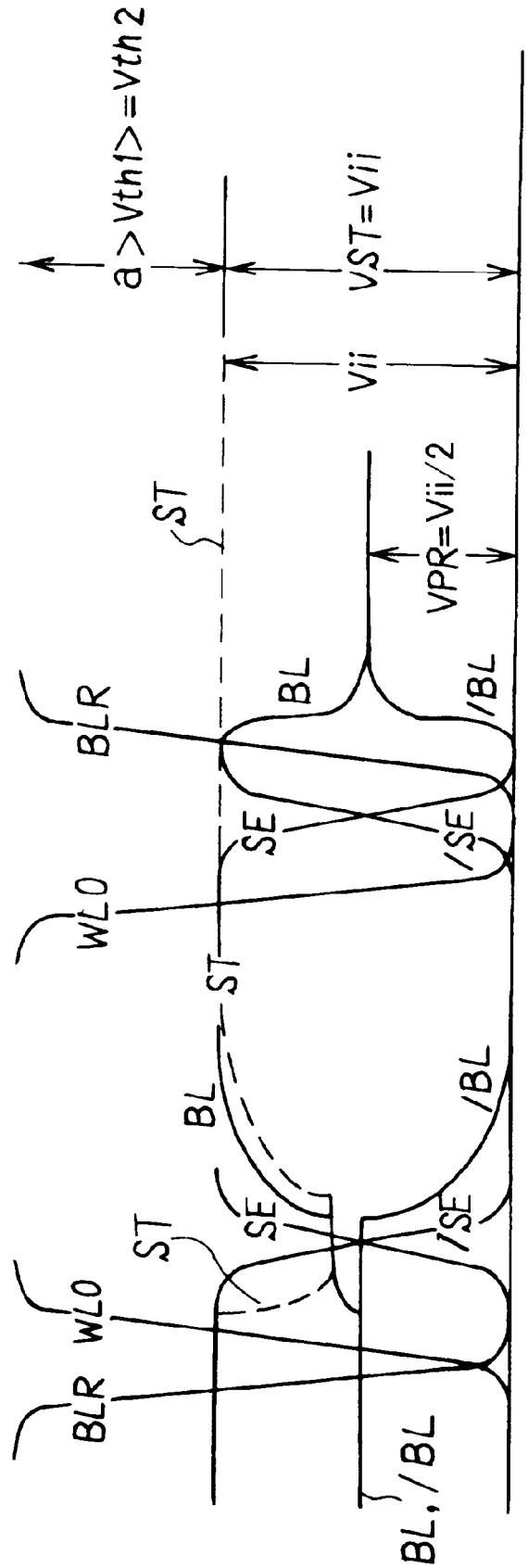
FIG. 2 is an operating waveform diagram for the read operation of the conventional DRAM of FIG. 1.
Figure 3:
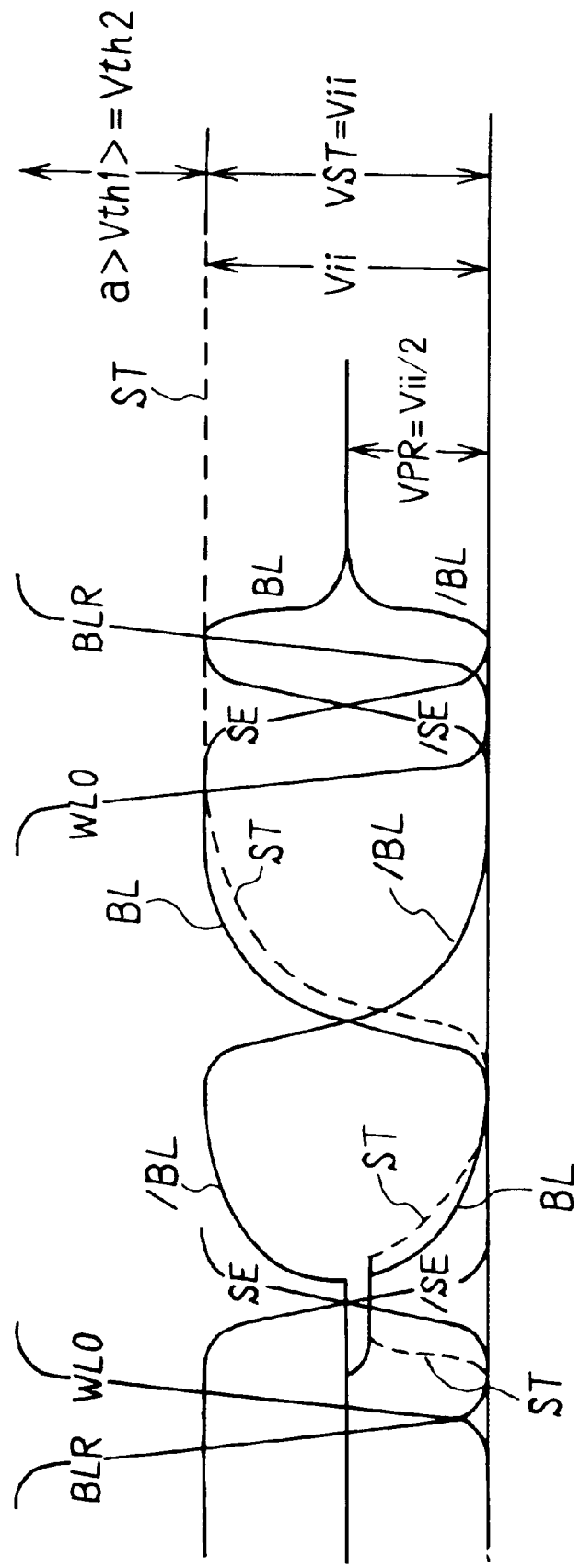
FIG. 3 is an operating waveform diagram for the write operation of the conventional DRAM of FIG. 2.
Figure 8A:
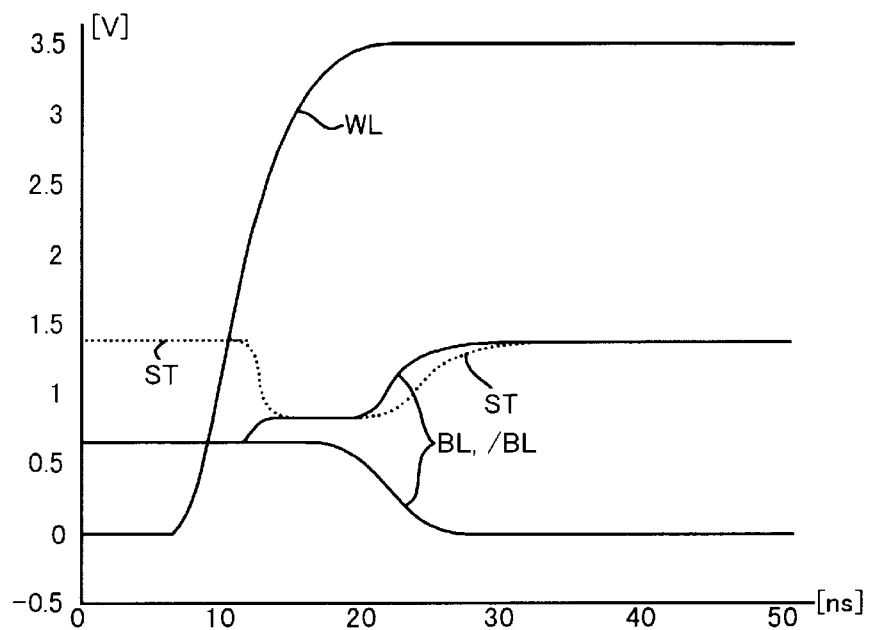
FIGS. 8A and 8B are simulation waveforms of the prior art and the first embodiment.
Figure 8B:
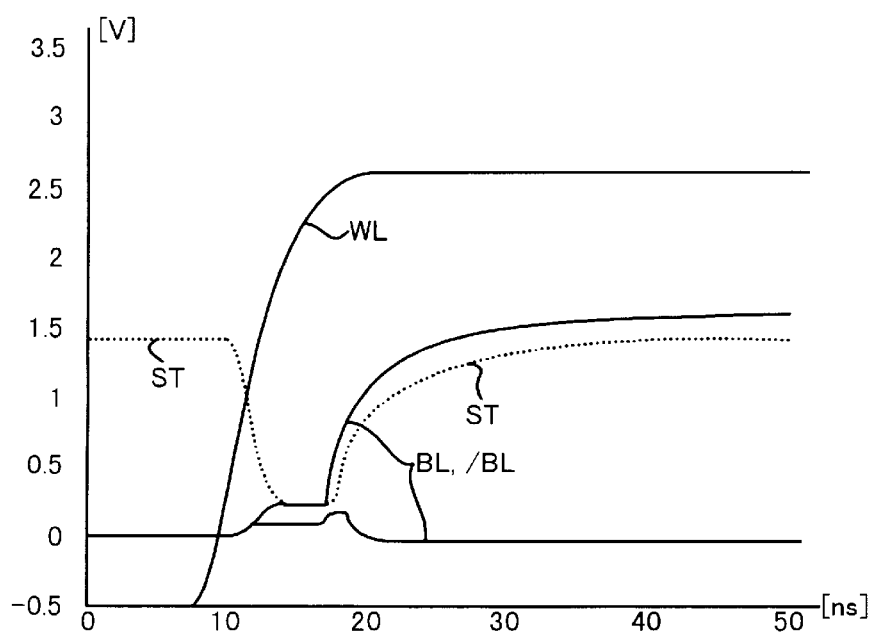

FIGS. 8A and 8B show simulation waveforms in the prior art and the first embodiment. FIG. 8A shows the voltages of the bit line pair BL and /BL and the cell capacitor ST in the memory cell, when rising the word lines and activating the sense amplifier in the prior art shown in FIGS. 1 and 2. As the drive voltage for the H level bit line BL is set to equivalent to the voltage in the memory cell, the voltage of the memory cell, which is shown by "ST" in the diagram, gently rises.

On the contrary, FIG. 8B shows a waveform diagram in the first embodiment. As the drive voltage for the H level bit line BL is set to be higher than the voltage of the cell capacitor ST, the voltage in the memory cell rises more sharply than the voltage of the cell capacitor ST in the prior art.

Figure 9:
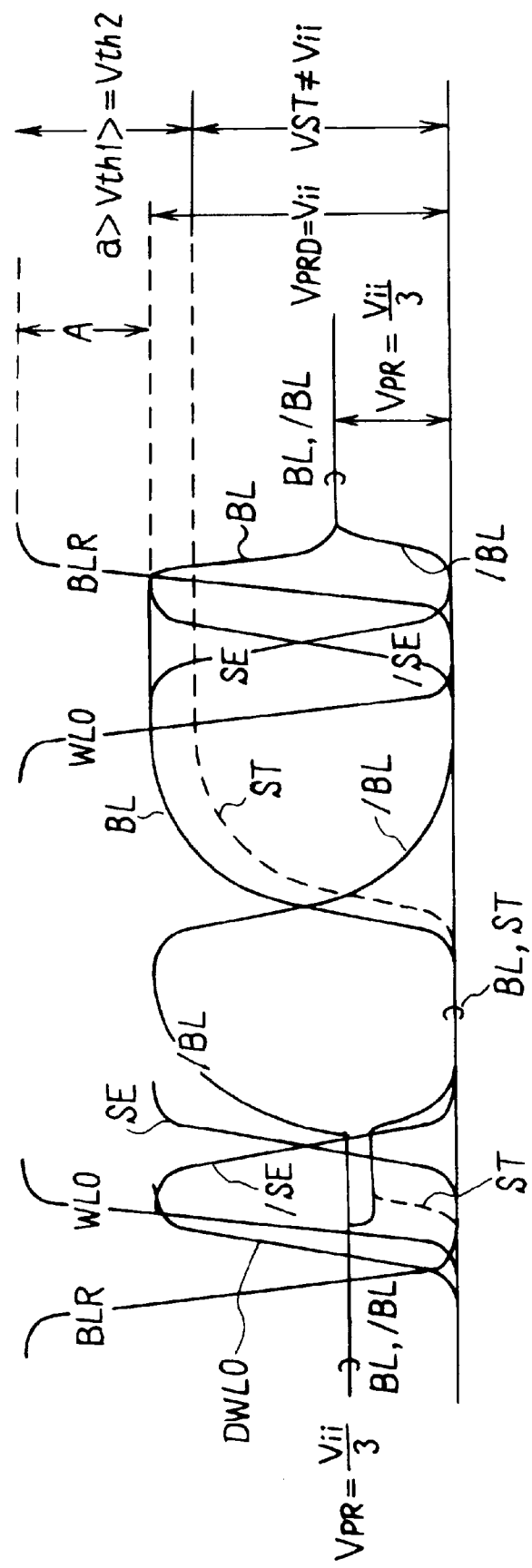
FIG. 9 is an operating waveform diagram for the write operation in the second embodiment.

FIG. 9 is an operating waveform diagram in the second embodiment. In the second embodiment, the voltage $V_{ST}$ for the H level memory cell is set to be lower than the drive voltage $V_{BLD}$ for the H level bit line, similar to the first embodiment. The pre-charge voltage $V_{PR}$ of the bit line, which is different from the first embodiment, is set to a voltage between the half of the internal power supply $V_{ii}$ and the ground voltage, for example, approximately one third of the internal power supply $V_{ii}$. Accordingly, since the bit line voltage rises by the memory cell storing the H level and falls by the memory cell storing the L level, the pre-charge voltage of the bit line is employed as a reference voltage, thus it is not necessary to provide the dummy cells. Therefore, the dummy cells DMC and the dummy word lines DWL are eliminated from the circuit diagram of FIG. 5 in a circuit diagram of the second embodiment.

When the pre-charge voltage $V_{PR}$ of the bit line is $V_{ii}/3$, the sense amplifier can operate with a lower internal power supply more appropriately than $V_{ii}/2$. Additionally, the amount of charges generating the very small voltage $\Delta V_{BL}$ between the bit lines is also more than the case where the pre-charge voltage is $V_{ii}/2$.

As shown in FIG. 9, the bit line pair BL and /BL are pre-charged to the voltage $V_{ii}/3$. Then, the capacitor in the memory cell $MC_0$ storing L level absorbs the charges from the bit line BL, in response to the rise of the word line $WL_0$, so as to lower the voltages of one bit line BL. The other bit line /BL maintains the pre-charge voltage $V_{ii}/3$. When activating the sense amplifier, the sense amplifier drives one bit line BL to the ground voltage, and drives the other bit line /BL to the internal power supply $V_{ii}$. After that, the writing circuit drives the bit line BL to the internal power supply $V_{ii}$, and the voltage of the capacitor ST in the memory cell is driven to the H level voltage $V_{ST}$. Then, the bit line pair BL and /BL are pre-charged in response to the reset signal BLR.

The write operation from the bit lines to the memory cells is executed in a short time in the second embodiment, too. As the pre-charge voltage of the bit lines is close to the ground voltage, the sense amplifier driven by a low internal power supply can normally drive the bit line, and a sufficient small voltage can be generated between the bit line pair.

As is explained above, according to the present invention, since the voltage of H level in the memory cell is set to be lower than the drive voltage of the bit lines, a voltage $V_{ds}$ between a drain and a source of a cell transistor can be more than a predetermined voltage, when writing and re-writing into memory cell, so as to increase a speed of writing data to the memory cell. Additionally, since the pre-charge voltage of the bit lines is set to be lower than the half of the amplitude of the bit line, it is possible to increase a very small voltage between bit line pair generated by the memory cell sufficiently. Further, since the pre-charge voltage of the bit line is set to be lower, the sense amplifier can operate appropriately even in a lower power supply.

What is claimed is:

1. A memory device including memory cells each formed of a cell capacitor for data storage and a cell transistor connected to bit and word line, comprising:

a pre-charging circuit for pre-charging the bit lines to a first voltage;

a sense amplifier for detecting the voltage of the bit lines and driving the bit lines to a second voltage for H level or a third level for L level, and a word line driving circuit for driving the word line so that a writing voltage for H level of the cell capacitor becomes a fourth voltage, which is lower than the second voltage, wherein the first voltage is lower than an intermediate value between the second and third voltages.

2. The memory device according to claim 1, wherein the word line driving circuit drives the word line to a fifth voltage higher than the fourth voltage for more than a threshold voltage of the cell transistor.

3. The memory device according to claim 1 or 2, wherein the first voltage is a ground voltage.

4. The memory device according to claim 1 or 2, wherein the dummy cell for generating a reference voltage according to the drive of the word line is provided to the bit line.

5. The memory device according to claim 3, wherein the word line driving circuit sets a non-selective voltage of the word lines to a negative voltage.

6. The memory device according to claim 1, further comprising:

a writing circuit for driving the bit line according to writing data, wherein the writing circuit drives the bit line to the second voltage for H level.

7. A driving method of the memory device having memory cells formed of a capacitor for data storage and cell transistor connected to bit and word line, comprising the steps of:

pre-charging the bit lines to a first voltage;

detecting the voltage of the bit line generated according to the drive of the word lines, and driving the bit line to the second voltage for H level or the third voltage for L level;

driving the word line so as to make the writing voltage for H level of the cell capacitor to the fourth voltage lower than the second voltage, wherein the first voltage is lower than an intermediate value between the second and third voltages.

* * * * *